United States Patent
Deneuville

(10) Patent No.: US 12,230,655 B2
(45) Date of Patent: Feb. 18, 2025

(54) IMAGE SENSOR FOR THE VISIBLE AND INFRARED RANGE HAVING AN ABSORBING LAYER STACK

(71) Applicant: Commissariat à l'Énergie Atomique et aux Énergies Alternatives, Paris (FR)

(72) Inventor: François Deneuville, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 323 days.

(21) Appl. No.: 17/477,332

(22) Filed: Sep. 16, 2021

(65) Prior Publication Data

US 2022/0093656 A1 Mar. 24, 2022

(30) Foreign Application Priority Data

Sep. 21, 2020 (FR) .................................... 2009549

(51) Int. Cl.
*H01L 27/146* (2006.01)
(52) U.S. Cl.
CPC .... *H01L 27/1462* (2013.01); *H01L 27/14621* (2013.01); *H01L 27/1464* (2013.01)
(58) Field of Classification Search
CPC .......... H01L 27/1462; H01L 27/14621; H01L 27/1464; H01L 27/14645; H01L 27/14649; H01L 27/14627; H01L 27/1463
See application file for complete search history.

(56) References Cited

U.S. PATENT DOCUMENTS

| | | | | |
|---|---|---|---|---|
| 6,071,661 A | * | 6/2000 | Hsieh | G03G 5/142 430/69 |
| 11,107,721 B2 | * | 8/2021 | Or-Bach | H10B 12/09 |
| 2015/0228689 A1 | * | 8/2015 | Lenchenkov | H01L 27/14649 257/432 |
| 2020/0203401 A1 | * | 6/2020 | Frey | H01L 27/14636 |
| 2023/0238416 A1 | * | 7/2023 | Noudo | H04N 13/243 257/291 |

OTHER PUBLICATIONS

Masanobu Iwanaga, "Perfect Light Absorbers Made of Tungsten-Ceramic Membranes", Applied Sciences 7, pag.458, 2017, doi:10.3390/app7050458. (Year: 2017).*
Preliminary Search Report for French Application No. 2009549, dated May 6, 2021.

* cited by examiner

*Primary Examiner* — Marcos D. Pizarro
*Assistant Examiner* — Tiberiu Dan Onuta
(74) *Attorney, Agent, or Firm* — Wolf, Greenfield & Sacks, P.C.

(57) ABSTRACT

An image sensor including a plurality of pixels, each including: a photodetector semiconductor region; a metal region arranged on a first surface of the semiconductor region; a band-pass or band-stop interference filter arranged on a second surface of the semiconductor region opposite to the first surface; and between the semiconductor region and the metal region, an absorbing stack comprising, in the order from the semiconductor region, a dielectric layer, a silicon layer, and a tungsten layer.

20 Claims, 8 Drawing Sheets

IMAGE SENSOR FOR THE VISIBLE AND INFRARED RANGE HAVING AN ABSORBING LAYER STACK

CROSS-REFERENCE TO RELATED APPLICATIONS

This application is a translation of and claims the priority benefit of French patent application number 20/09549, filed on Sep. 21, 2020. The contents of which is hereby incorporated by reference in its entirety.

TECHNICAL BACKGROUND

The present disclosure generally concerns electronic devices, and more particularly aims at an image sensor.

PRIOR ART

Conventionally, an image sensor enables to obtain images of a scene in the visible and/or in the infrared range.

For example, the sensor captures the visible radiations originating from a scene to obtain a visible image. The image corresponds to radiations captured in one or a plurality of wavebands, for example, in three wavebands respectively corresponding to the blue, green, and red colors.

Certain image sensors use infrared radiations to obtain a three-dimensional image of the scene. For example, the sensor is associated with an infrared pulse emitter. The travel time of the pulses from the emitter to the scene, and then from the scene to the sensor, delivers depth information. The three-dimensional image is obtained from the depth information. Such a sensor is called time of flight sensor TOF. Such a sensor captures the radiations in a waveband corresponding to the wavelengths of the pulses emitted by the emitter. This band is typically located in near infrared, that is, infrareds having wavelengths smaller than 1,100 nm. The sensor may deliver the depth map of the scene only, or the three-dimensional image formed of the depth map combined with the visible image.

An image sensor comprises a plurality of pixels generally arranged in an array. The radiations of each waveband of interest of the sensor are specifically captured by pixels, distributed in the array, mainly sensitive to the radiations in this waveband.

In practice, when a pixel is designed to be sensitive to radiations in a waveband, this pixel is also sensitive to radiations located outside of the band. The radiations located outside of the targeted band form parasitic radiations having their detection by the pixel decreasing the quality of the image. It is thus desirable for pixels designed to be sensitive to radiations in one of the wavebands to be as little sensitive as possible to the radiations located outside of this band.

SUMMARY

An embodiment provides an image sensor comprising a plurality of pixels, each comprising:
  a photodetector semiconductor region;
  a metal region arranged on a first surface of the semiconductor region;
  a band-pass or band-stop interference filter arranged on a second surface of the semiconductor region opposite to the first surface; and
  between the semiconductor region and the metal region, an absorbing stack comprising, in the order from the semiconductor region, a dielectric layer, a silicon layer, and a tungsten layer.

According to an embodiment, the absorbing stack is capable of absorbing, in a single passage, more than 50% of an incident radiation at the central wavelength of the pass-band or of the stop band of the interference filter.

According to an embodiment, in each pixel, the semiconductor layer is made of silicon.

According to an embodiment, the silicon layer has a thickness in the range from 20 to 100 nm.

According to an embodiment, the tungsten layer has a thickness greater than or equal to 40 nm.

According to an embodiment, the dielectric layer comprises one or a plurality of dielectric materials having refraction indexes smaller than that of silicon.

According to an embodiment, in each pixel, the tungsten layer is coupled to a node of application of a bias potential.

According to an embodiment, in each pixel, the interference filter comprises a repetition of alternated layers having different optical indexes.

According to an embodiment, in each pixel, the central wavelength is in a wavelength range from 700 nm to 1,100 nm.

According to an embodiment, each pixel comprises an additional colored or infrared filter covering the first surface of the semiconductor region.

According to an embodiment, the pixels are configured to detect visible light, the sensor further comprising a plurality of depth pixels configured to detect infrared light.

According to an embodiment, the absorbing stack is present in the depth pixels.

According to an embodiment, the absorbing stack is not present in the depth pixels.

BRIEF DESCRIPTION OF THE DRAWINGS

The foregoing and other features and advantages will be discussed in detail in the following non-limiting description of specific embodiments in connection with the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, elements of the image sensor such as circuits comprising transistors allowing the operation of pixels are not detailed, the described embodiments being compatible with usual circuits allowing the operation of the pixels of an image sensor. Further, the selection of thicknesses of layers of antireflection stacks for a given wavelength, and of band pass or band stop filters in given wavebands, are not described in detail, the described stacks and filters being compatible with usual methods enabling to select the thicknesses of the layers of antireflection stacks and of interference filters.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Unless specified otherwise, the optical index designates the real part of the complex optical index.

Figure 1:
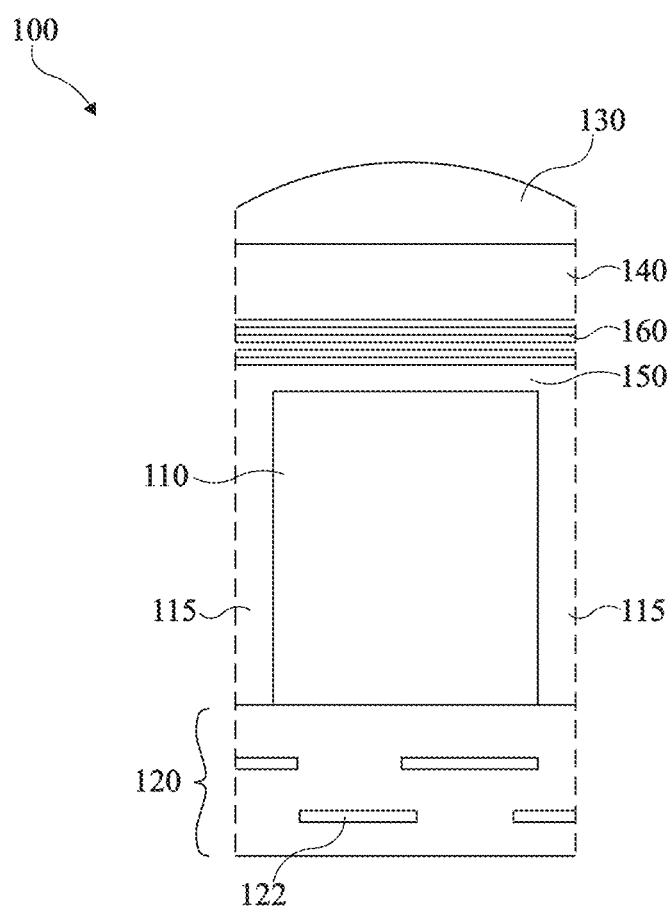
FIG. 1 is a cross-section view schematically showing an example of an image sensor pixel.

FIG. 1 is a cross-section view schematically showing an example of a pixel 100 of an image sensor. The pixel is for example located in an array of pixels and has its lateral edges in contact with neighboring pixels.

In the orientation of the drawing, the sensor is intended to receive an optical radiation arriving from the top of the pixels. The term optical radiation here designates a visible radiation or a radiation located in near infrared. The optical radiation typically originates from an element of a scene located opposite the pixel.

Pixel 100 comprises a semiconductor photodetector region 110, typically made of silicon. Semiconductor region 110 may be delimited by insulating trenches 115 filled with an electric insulator, for example, silicon oxide. As a variation, the trenches comprise conductors insulated from region 110. Trenches 115 separate the various semiconductor regions 110 from the neighboring pixels of the image sensor.

As an example, the pixel extends laterally across a width in the range from 1.2 to 5 micrometers, for example, in the order of 1.4 micrometers. Region 110 typically has a thickness, corresponding to the height in the orientation of the drawing, in the range from 2 to 10 micrometers, for example, in the order of 6 micrometers.

Semiconductor region 110 has its lower surface, or front surface, covered with an insulating layer 120. Metal regions 122 are located in layer 120. Regions 122 are typically conductive elements such as conductive tracks and/or conductors filling vias. The conductive elements connect to one another components, not shown, such as transistors, which allow the operation of the pixel and/or of various portions of the image sensor.

In the shown example, the pixel comprises a lens 130 on the optical radiation incoming side. Lens 130 enables to focus the optical radiations towards photodetector region 110.

Further, pixel 100 may comprise a filter 140 covering the surface of photodetector region 110 located on the side on which the optical radiations arrive. Filter 140 is preferably located between lens 130 and photodetector region 110. Filter 140 is used to select the wavelengths of the radiations detected by the pixel. Preferably, filter 140 is an organic filter, for example, made of resin. Filter 140 may form an infrared filter, that is, giving way to optical radiations in infrared wavelengths, preferably in near infrared. Filter 140 may form a colored filter, that is, giving way to optical radiations in a waveband in the visible range, preferably corresponding to the red, green, or blue color.

The pixel may further comprise an antireflection layer 150. Layer 150 may comprise one or a plurality of dielectric layers. Antireflection layer 150 is provided to limit the upward reflection of optical radiations at the wavelengths detected by the pixel.

Pixel 100 further comprises an interference filter 160. An interference filter is a stack of a plurality of layers having alternated optical indexes. As an example, the interference filter comprises, preferably is formed by, an alternation of first and second layers, the first layers being identical to one another and the second layers being identical to one another. Preferably, the interference filter comprises at least two, for example, at least three, first layers and at least two, for example, at least three, second layers. As an example, the first layers are dielectric, and the second layers are dielectric and/or are metal layers sufficiently thin to be at least partially transparent. The interference filter is preferably formed by silicon oxide layers, having silicon or titanium oxide or silicon nitride layers interposed therebetween. The thickness of the interference filter is preferably smaller than the width of region 110, for example, smaller than 2.0 micrometers. Interference filter 160 may be a band stop or band pass filter, that is, respectively block or give way to radiations in a waveband.

Figure 2:
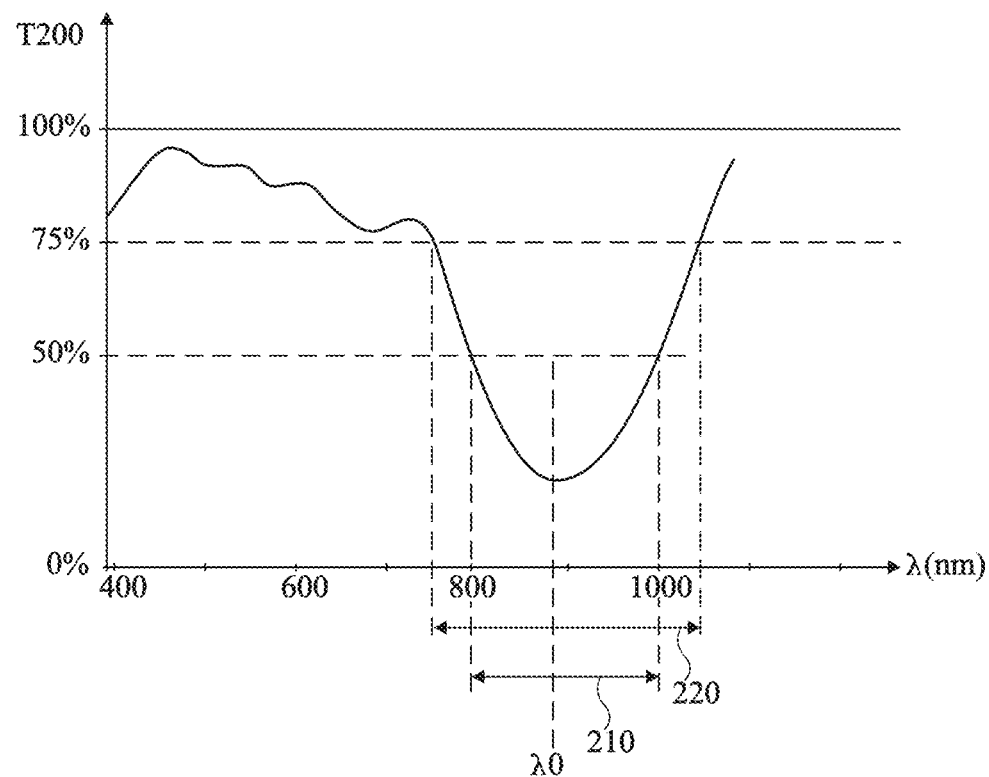
FIG. 2 is a diagram schematically illustrating an example of the variation, according to the wavelength, of the transmission of a filter of the pixel of FIG. 1.

FIG. 2 is a diagram schematically illustrating, as an example, the variation according to wavelength $\lambda$ (in abscissas, in nm) of the transmission T200 (in ordinates, between 0% and 100%) of the interference filter 160 of the pixel of FIG. 1, in the case where filter 160 is a band stop filter. The transmission is defined, for a radiation reaching the upper surface of filter 160 and substantially orthogonal to the mean plane of the layers of filter 160, as being equal to the percentage of this radiation which comes out of the lower surface of the filter.

The band stop interference filter is designed to block radiations in near infrared, around a central wavelength λ0 for example in the range from 700 to 1,100 nanometers (in the order of 875 nm in the shown example). Central wavelength λ0 for example corresponds to a transmission minimum. Preferably, filter 160 gives way to less than 30% of the radiation at wavelength λ0. Preferably, the interference filter is designed so that the transmission is low, for example, lower than 50%, in a wavelength range 210, and high, for example, higher than 75%, outside of a wavelength range 220 including range 210. Range 210 defines the stop band of the filter. As an example, range 210 has a width greater than 150 nm and is entirely between 700 and 1,100 nanometers, and range 220 has a width greater than 250 nm. The difference between the widths of ranges 220 and 210 is for example in the range from 100 to 200 nm.

In the present example, interference filter 160 comprises seven alternated layers of silicon oxide and of silicon nitride. The total thickness of the filter is in the order of 1.0 micrometer.

Such a band stop interference filter is preferably used in near infrared when the pixel is provided to detect visible light. Optional filter 140 then is a colored filter. Although filter 140 is designed to only give way to radiations of a waveband in the visible range, in practice, when filter 140 is for example made of resin, filter 140 also gives way to radiations in near infrared. Interference filter 160 then aims at limiting the detection of radiations in near infrared.

The inventors have observed that in fact, despite the presence of interference filter 160, radiations in the waveband partially cut by interference filter 160 remain detected by detection region 110. Thereby, in the image sensor, the detection of near infrared radiations adds to the detection of visible radiations corresponding to the image, which decreases the quality of the image.

Figure 3:
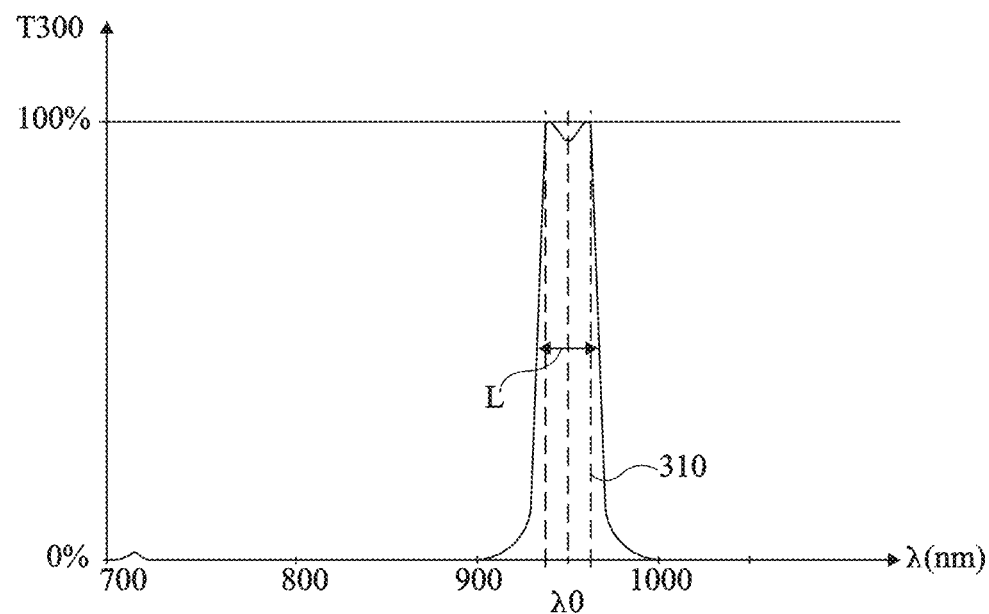
FIG. 3 is a diagram schematically illustrating another example of the variation, according to the wavelength, of the transmission of a filter of the pixel of FIG. 1.

FIG. 3 is a diagram schematically illustrating, as an example, the variation according to wavelength λ (in abscissas, in nm) of the transmission T300 (in ordinates, between 0% and 100%) of the interference filter 160 of the pixel of FIG. 1, in the case where filter 160 is a band-pass filter.

The band-pass interference filter is designed to give way to radiations in a waveband around a central wavelength λ0. The central wavelength is preferably located in near infrared, for example, in the range from 700 to 1,100 nm (in the order of 950 nm in the shown example). The transmission preferably has the shape of a peak around the central wavelength. The transmission is for example close to 100% for central wavelength λ0 and decreases on either side of wavelength λ0. The length L at mid-height of the peak is typically in the order of 35 nm. The peak may have a plurality of apexes (two apexes in the shown example) and the half-maximum is defined by half the height of the highest apex. The transmission band, or passband, of the filter is defined by the wavelengths for which the transmission is greater than the half maximum of the peak. Central wavelength λ0 then corresponds to the center of the passband. The transmission is close to zero, for example, smaller than 1%, more than 50 nm away from central wavelength λ0.

Filter 160 comprises in the present example eighteen alternated layers of silicon oxide and of silicon. The total thickness of the filter is for example in the order of 1.5 micrometer.

Such a band-pass filter is for example used when the sensor is of time-of-flight type, associated with an infrared pulse emitter. The filter is then designed so that the wavelengths of the pulses are located in the passband of the filter. For example, the wavelength of the pulses is located in a band 310 centered on wavelength λ0. As an example, band 310 has a width in the order of 25 nm. Preferably, filter 140 then only gives way to infrared radiations, which enables to cut off possible secondary peaks that filter 160 might exhibit outside of the infrared radiation range. As a variation, filter 140 may be omitted.

The inventors have observed that in practice, photodetector region 110 detects radiations in a waveband wider than the desired transmission peak. Thereby, the pixel detects, in addition to the pulses, infrared radiations located outside of band 310. The infrared radiations form parasitic radiations which adversely affect the quality of the obtained depth map.

The embodiments described hereafter enable to improve the quality of the images obtained from visible radiations, and/or the quality of the depth images.

Figure 4:
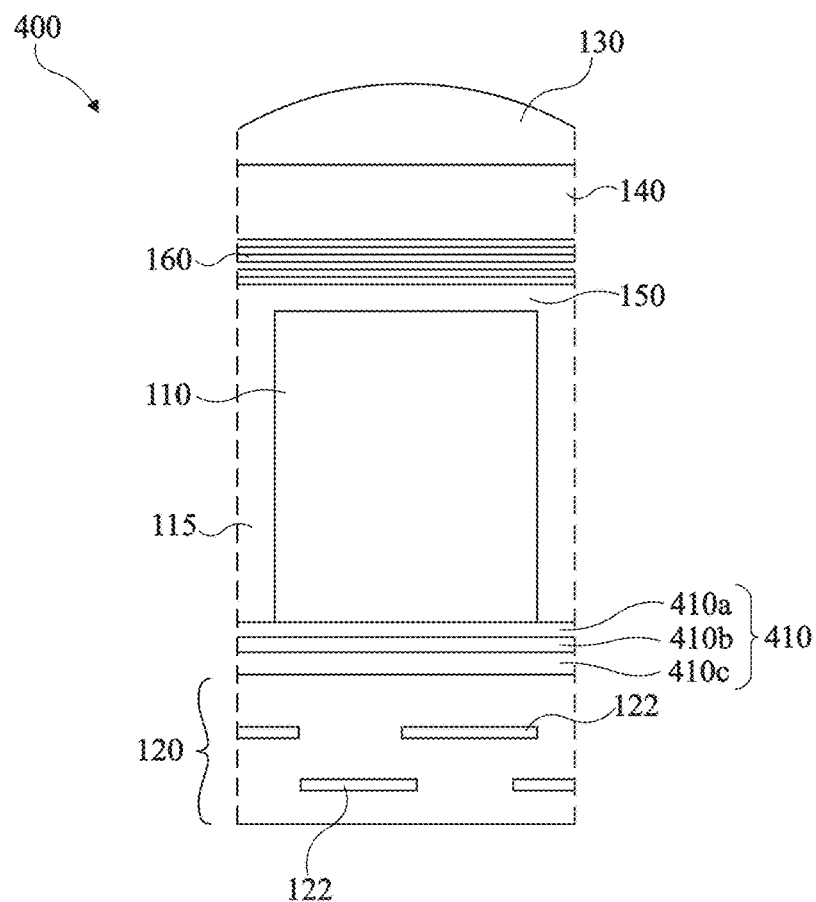
FIG. 4 is a cross-section view schematically showing an example of an embodiment of an image sensor pixel.

FIG. 4 is a cross-section view schematically showing an embodiment of an image sensor pixel 400.

Pixel 400 comprises elements identical or similar to those of the pixel 100 of FIG. 1, arranged identically or similarly, that is:

a semiconductor photodetector region 110, for example, delimited by insulating trenches 115;
one or a plurality of metal regions 122;
an interference filter 160; and
preferably, a lens 130 and/or a filter 140, and/or an antireflection layer 150.

These elements will not be described again in detail hereafter.

Pixel 400 comprises, between metal region(s) 122 and photodetector region 110, an absorbing structure 410. Preferably, the pixel comprises no metal elements between photodetector region 110 and absorbing structure 410.

Absorbing structure 410 is formed by a stack of layers comprising, in the order from the lower surface of photodetector region 110, a dielectric layer 410a, a silicon layer 410b, and a tungsten layer 410c. Layer 410a is for example a silicon oxide layer or a silicon nitride layer. As a variant, layer 410a may be formed by a stack of a plurality of layers made of dielectric materials having refraction indexes smaller than that of silicon, for example, one or a plurality of silicon oxide layers and one or a plurality of silicon nitride layers. Dielectric layer 410a is for example in contact, by its upper surface, with the lower surface of photodetector region 110. Layer 410a particularly enables to electrically insulate layers 410b, 410c and the conductive elements 122 of photodetector region 110. Silicon layer 410b is for example in contact, by its upper surface, with the lower surface of dielectric layer 410a. Tungsten layer 410c may be in contact, by its upper surface, with the lower surface of silicon layer 410b. As a variant, a thin bonding layer, for example, made of titanium nitride, for example, having a thickness smaller than 10 nm, may form an interface between silicon layer 410b and tungsten layer 410c.

The thicknesses of the layers 410a, 410b, and 410c of stack 410 are selected so that stack 410 has, for the central wavelength λ0 of interference filter 160, an absorption coefficient greater than that of the semiconductor material of region 110. Stack 410 is sized so that, for the central wavelength λ0 of interference filter 160 and for an incident radiation substantially orthogonal to the average plane of stack 410, more than 50%, preferably more than 80%, preferably more than 95%, of the radiation entering into stack 410 is absorbed in stack 410 in a single passage. In other words, more than 50%, preferably more than 80%, preferably more than 95%, of a radiation entering through the upper surface of stack 410 is absorbed in stack 410 and is not reflected towards region 110. For example, for wavelength λ0, approximately 90% of the radiation entering stack 410 is absorbed in stack 410 in a single passage. For example, more than 50%, preferably more than 80%, preferably more than 90% of any radiation in the wavelength range from 900 nm to 1,000 is absorbed in a single passage through stack 410. Preferably, more than 90% of any radiation in the stop band or in the pass band of filter 160 is absorbed in a single passage through stack 410.

Respectively designating with N1 the refraction index of layer 410a, with N2 the refraction index of layer 410b, and with N3 the refraction index of layer 410c, and considering the thicknesses of layers 410a and 410c as infinite (or more precisely semi-infinite), it can be shown that the reflection of stack 410 is null if the following equation is verified:

$$N3 = N2 \cdot \frac{N1 - i \cdot N2 \cdot \tan\delta}{N2 - i \cdot N3 \cdot \tan\delta} \quad \text{[Math 1]}$$

with $$\delta = 2\pi \cdot N2 \cdot \frac{d}{\lambda} \quad \text{[Math 2]}$$

where d is the thickness of layer 410b.

If, however, N3 comprises a non-zero imaginary part, then the transmission is null and the wave is integrally absorbed by stack 410.

Studies made by the inventor have shown that by taking N1 equal to the refraction index of silicon oxide and N2 equal to the refraction index of silicon, and for a wavelength λ=940 nm, the selection of tungsten as the material of layer 410c (index N3) enables to approach at closest the equality of the above equation [Math 1]. A silicon thickness d=39 nm then enables to obtain a maximum absorption (close to 100%) of the radiation by stack 410.

Figure 5:
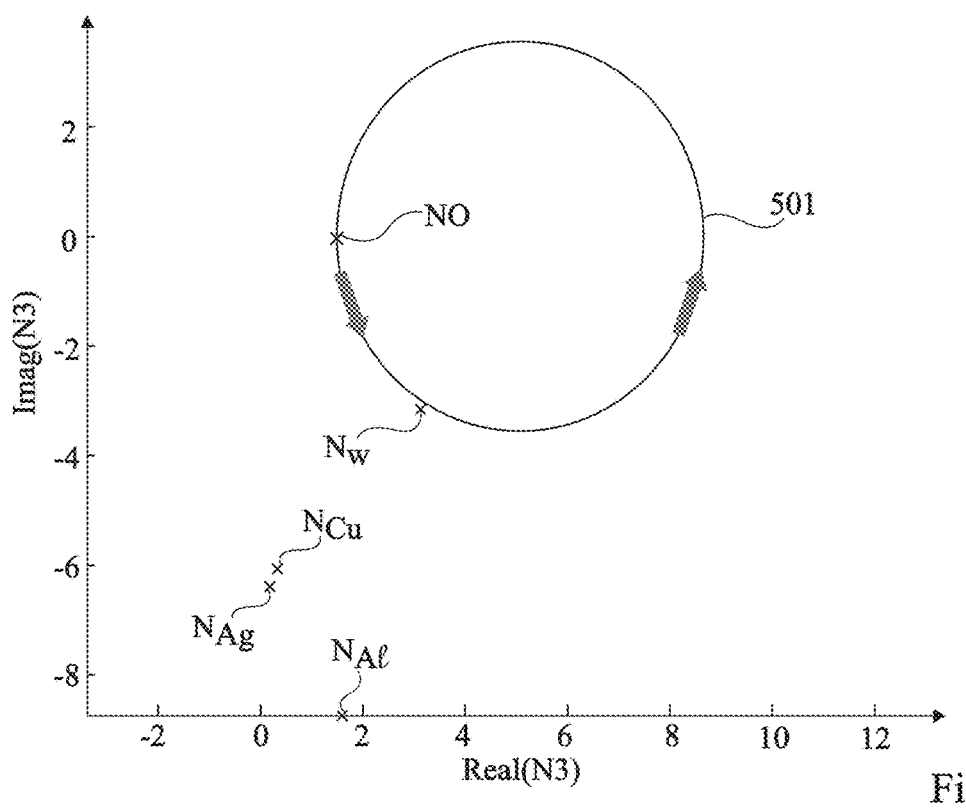
FIG. 5 is a diagram illustrating the parameterizing of an absorbing stack of the pixel of FIG. 4.

FIG. 5 illustrates the relevance of the selection of tungsten over other materials currently used in integrated circuits.

Considering the above-mentioned equation [Math 1], FIG. 5 is a diagram illustrating the variation of the complex optical index N3 when the thickness d of silicon layer 410b varies from 0 to 130 nm. More particularly, in the diagram of FIG. 5, the axis of abscissas represents the real part Real (N3) of index N3 and the axis of ordinates represents the imaginary part Imag (N3) of index N3. The circular curve 501 of FIG. 5 represents the variation of index N3 (real part and imaginary part) when thickness d varies from 0 to 130 nm. The point NO of curve 501 corresponds to the value taken by index N3 for d=0 and for d=130 nm. For these thicknesses, the imaginary part of index N3 is zero.

One has further plotted on the diagram of FIG. 5 a point $N_W$ corresponding to the complex optical index of tungsten, a point $N_{Cu}$ corresponding to the complex optical index of copper, a point $N_{Ag}$ corresponding to the complex optical index of silver, and a point $N_{Al}$ corresponding to the complex optical index of aluminum.

As appears in the drawing, point $N_W$ nearly coincides with a point of circle 501 having a non-zero imaginary part. This point corresponds to the value of index N3 for a silicon thickness d equal to 39 nm. Points $N_{Cu}$, $N_{Ag}$ and $N_{Al}$ are very distant from circle 501. This shows that, among the above-mentioned metals, tungsten is the only relevant candidate to obtain the desired absorption effect.

In practice, the thicknesses of layers 410a and 410c are of course not semi-infinite. Further, as indicated hereabove, dielectric layer 410a may comprise one or a plurality of dielectric materials other than silicon oxide. Digital simulations enable to adjust the silicon thickness d to be provided to maximize the absorption, according to the different parameters of stack 410 and/or to the central wavelength λ0 of interference filter 160. As an example, the thickness d of silicon layer 410b is in the range from 20 to 100 nm, and preferably from 30 to 50 nm.

Further, to maximize the absorption in stack 410, the thickness of tungsten layer 410c is preferably relatively high, for example, greater than 40 nm and preferably greater than 60 nm.

In the case where interference filter is a stop-band filter of the type described in relation with FIG. 2, the presence of absorbing structure 410 enables to decrease the detection of parasitic radiations in near infrared, and thus to improve the quality of the image.

In the case where the interference filter is a band-pass filter of the type described in relation with FIG. 3, among the detected infrared radiations, the proportion of infrared radiations located outside of band 310 is smaller in the pixel of FIG. 4 than in the pixel of FIG. 1. The presence of layer 410 thus decreases the proportion of detected parasitic radiations and thus enables to improve the quality of the captured depth image.

Figure 6:
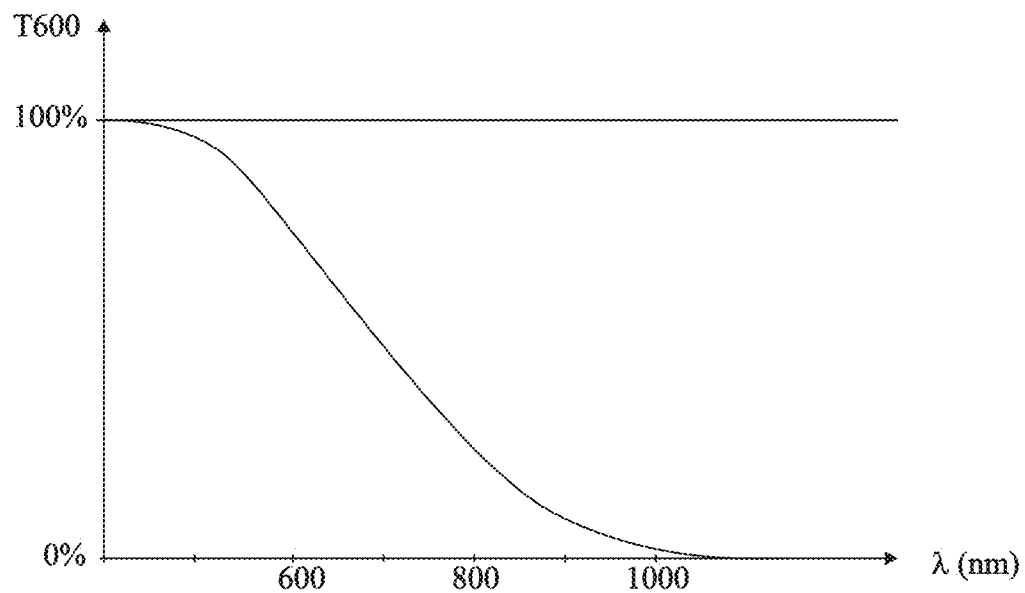
FIG. 6 is a diagram schematically illustrating an example of the variation, according to the wavelength, of the absorption of optical radiations by a semiconductor photodetector region.

An explanation of the function of layer 410 is detailed hereafter in relation with FIG. 6.

FIG. 6 is a diagram schematically illustrating, as an example, the variation according to wavelength λ (in abscissas, in nm) of the absorption T600 of the optical radiations by photodetector region 110, in a single passage through photodetector region 110.

The radiations located in near infrared are partially absorbed and detected by region 110. For example, for the central frequency λ0 of the interference filter, region 110 absorbs and detects in a single passage typically from 1 to 50%, preferably from 2 to 25%, of the radiations which reach region 110.

In the absence of absorbing structure 410, a radiation reaching region 110 may cross region 110 a first time from top to bottom almost without being absorbed, and then a second time from bottom to top after having been reflected on metal region(s) 122. The radiation then performs a return travel.

For certain wavelengths, interference filter 160 gives way to a portion only, for example, from 1% to 80%, of the radiation. This for example occurs for the entire waveband cut by the band stop filter of FIG. 2, and in the lateral portions of the transmission peak of the band-pass filter of FIG. 3. The interference filter then reflects the non-transmitted portion of the radiation.

In the absence of absorbing layer 410, for such wavelengths of partial transmission by filter 160, the radiation having crossed filter 160 then performs multiple return travels between, at the bottom, metal regions 122 and, at the top, partially reflective filter 160. The less the interference filter gives way to radiation, the more reflective it is and the higher the number of return travels. Thus, the decrease by filter 160 of the radiations reaching region 110 goes along with an increase in the number of passages through region 110. Once it has entered region 110, a radiation is all the more detected at the number of return travels is large. Accordingly, the decrease of the radiation entering through filter 160 does not result in a decrease of same amplitude of the detection sensitivity of the pixel.

In the presence of absorbing stack 410, the number of passages of the radiation through region 110 is limited by stack 410. This decreases the sensitivity of detection of radiations for wavelengths of partial transmission of filter

160. In the presence of absorbing stack 410, the partial blocking by filter 160 of parasitic radiations then results in a corresponding decrease in the sensitivity of detection by the pixel of parasitic radiations. The quality of the visible and/or infrared image has thus been improved.

Figure 7:
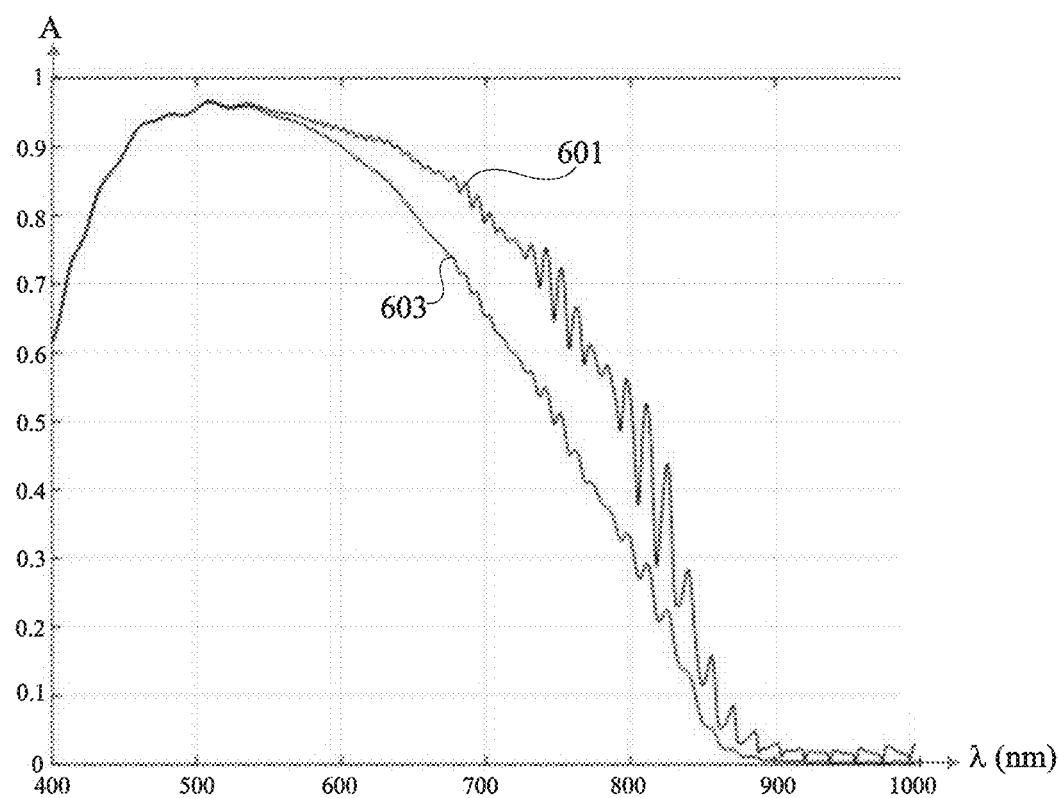
FIG. 7 is a diagram schematically illustrating an example of the variation, according to the wavelength, of the absorption of the optical radiations by a photodetector semiconductor region in the pixel of FIG. 1 and in the pixel of FIG. 4.

FIG. 7 is a diagram schematically illustrating an example of variation, according to wavelength λ (in nm, in abscissas), of the absorption A (in ordinates, from 0 to 1) of the optical radiations by photodetector semiconductor region 110 in the pixel of FIG. 1 (curve 601 of FIG. 7) and in the pixel of FIG. 4 (curve 603 of FIG. 7).

Strong oscillations can be observed on curve 601 for wavelengths beyond approximately 700 nm. These oscillations illustrate the effect described hereabove in relation with FIG. 6. More particularly, in the pixel of FIG. 1, semiconductor region 110 forms a cavity for radiations close to the central wavelength of interference filter 160. This cavity has resonances at certain frequencies, which explains the oscillations of curve 601. This cavity effect degrades the quality of the acquired images.

In curve 603, it can be observed that the oscillations are strongly decreased. This results from the provision of absorbing structure 410, which enables to avoid the above-described resonant cavity effect.

Although a silicon photodetector region, partially detecting radiations in near infrared, has been described herein, the photodetector region may be made of another semiconductor. This other semiconductor may then have a wavelength range where it only partially absorbs and detects radiations. The central wavelength of the interference filter is selected in this range. Preferably, absorbing structure 410 is sized to absorb in a single passage more than 50%, for example, more than 80%, of the entire radiation of this wavelength range.

Figure 8:
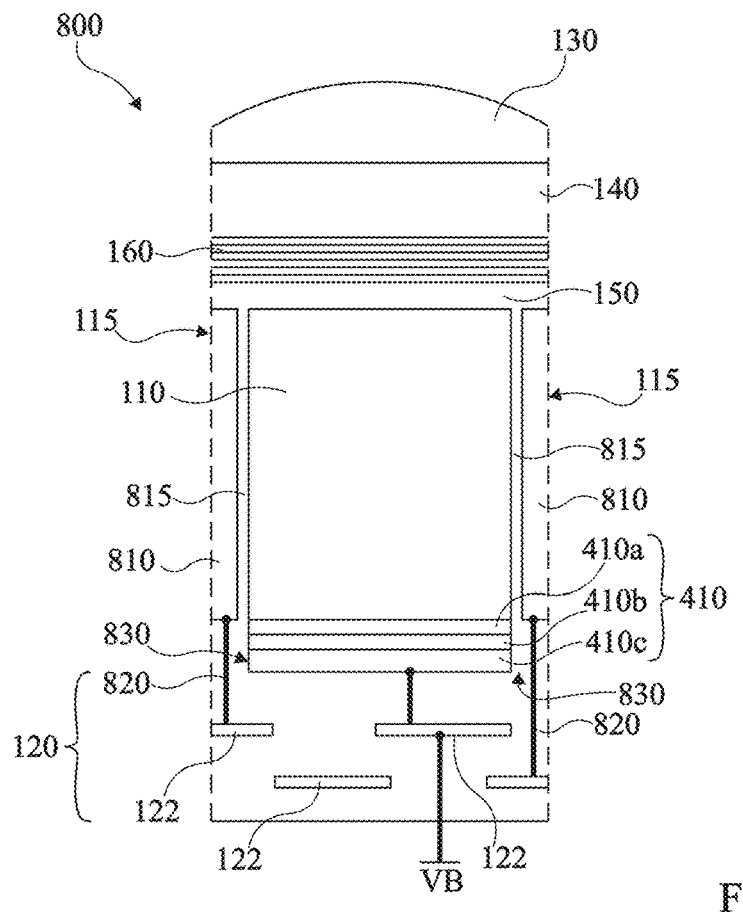
FIG. 8 is a cross-section view schematically showing an alternative embodiment of the pixel of FIG. 4.

FIG. 8 is a cross-section view schematically showing an alternative embodiment 800 of the pixel of FIG. 4.

In this variant, the tungsten layer 410c of absorbing stack 410 is coupled, preferably connected, to a node of application of a bias potential VB, for example, via one of the metal regions 122 forming an interconnection track. The application of a bias voltage to absorbing stack 410 enables to discharge possible electric charges trapped in insulating layer 410a. Further, the application of this bias potential may enable to avoid storing charges in layers 410b and/or 410c, which might disturb the electric potential of region 110.

As an example, insulating trenches 115 each comprise a conductive region 810 insulated from region 110 by an electrically-insulating material 815. Regions 810 are coupled, preferably connected, to some of metal regions 122 by connections 820. A capacitive element enabling to electrostatically influence region 110 and/or to decrease or neutralize the dark current has thus been obtained for each trench. Indeed, the decrease or the neutralization of the dark current may be obtained by accumulation of holes to store electrons, or of electrons to store holes.

Stack 410 has openings 830 at the level of connections 820. Openings 830 enable to electrically insulate the connections 820 of absorbing stack 410. Any electric connection crossing stack 410 may be insulated from layer 410 by an opening 830. These electric connections for example form contacts towards elements of the pixel such as transistors or junctions. Openings 830 are preferably located at the level of the pixel edges. However, regions 810, connections 820, and openings 830 may be omitted.

Figure 9:
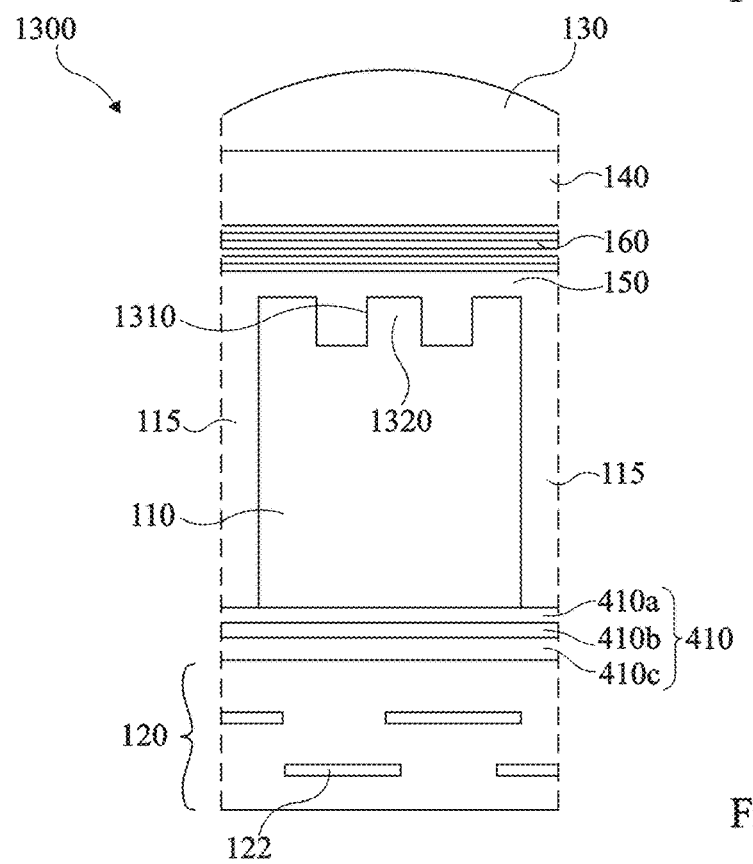
FIG. 9 is a cross-section view showing another alternative embodiment of the pixel of FIG. 4.

FIG. 9 is a cross-section view schematically showing another alternative embodiment 1300 of the pixel of FIG. 4. In this variation, cavities 1310 extend in region 110 from its upper surface. Cavities 1310 are filled with a dielectric material, for example, silicon oxide. Cavities 1310 are preferably arranged in a grating. The pitch of the grating is for example greater than half a central wavelength of the waveband detected by the pixel. In the case where filter 160 is a band-pass filter, the pitch of the grating is preferably greater than half the central wavelength λ0 of filter 160.

The cavities 1310 and the portions 1320 of region 110 arranged between these cavities form a diffraction grating. The diffraction grating introduces angles in the propagation of radiations entering from the top of photodetector region 110. This radiation then performs a plurality of return travels with a horizontal component in region 110 between the lateral walls of region 110. The length of the travel of the radiation within region 110, and thus the probability for the radiation to be detected by region 110, are thus increased. Conversely to the return travels between the bottom and the top of the pixel, the number of which depends on the transmission of filter 160, horizontal return travels increase the detection substantially in the same way for all the wavelengths of the band detected by the pixel. Thus, the diffraction grating in the upper portion of region 110 provides pixel 1300 with a sensitivity to radiations greater than that of a pixel which does not comprise this diffraction grating, while keeping the advantage of the image quality provided by limiting of the number of vertical return travels.

Figure 10:
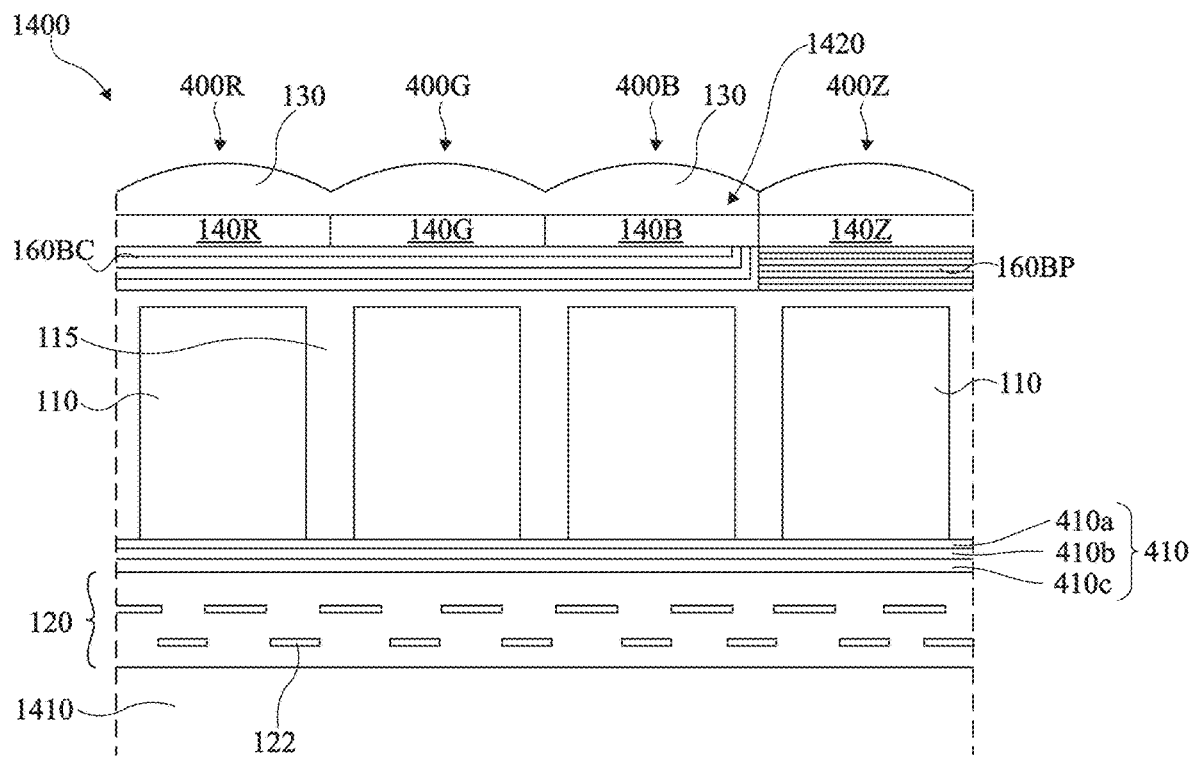
FIG. 10 is a cross-section view partially and schematically showing an example of an embodiment of an image sensor.

FIG. 10 is a cross-section view partially and schematically showing an embodiment of an image sensor 1400 comprising pixels of the type of pixel 400 of FIG. 4. Sensor 1400 may capture three-dimensional color images or color and infrared images.

More particularly, a group of four pixels 400R, 400G, 400B, and 400Z, of sensor 1400 has been shown. Pixels 400R, 400G, 400B, and 400Z, each correspond to the pixel 400 of FIG. 4 where filter 140 is formed by a filter, respectively 140R, 140G, 140B, and 140Z, respectively giving way to blue light, green light, red light, and radiations in near infrared. Filter 140Z is optional.

In each of pixels 400R, 400G, and 400B, the interference filter 160 of the pixel 400 of FIG. 4 is formed by a band-stop interference filter 160BC, of the type of the filter of FIG. 2. Preferably, filter 160BC is a same continuous filter common to pixels 400R, 400G, and 400B. In pixel 400Z, the interference filter 160 of pixel 400 of FIG. 4 is formed by a band-pass interference filter 160BP, for example, of the type of the filter of FIG. 3.

In the example, absorbing stack 410 and layer 120 are common for the various pixels of the sensor, and in particular common to the four pixels in the group of shown pixels.

As mentioned hereabove, absorbing stack 410 limits the number of return travels performed by light between the top and the bottom of each of the pixels, thus improving the quality of the captured image.

Further, absorbing stack 410 limits the quantity of optical radiation, particularly infrared, which, after having crossed from top to bottom the region 110 of one of the pixels, is reflected by metal regions 122 towards the neighboring pixels. This corresponds to an additional improvement of the image quality.

To form pixels 400R, 400G, 400B, and 400Z, preferably, regions 110 and the trenches 115 separating regions 110 are previously formed in a semiconductor substrate. One then successively forms, on the front surface of the substrate (lower surface), the layers 410a, 410b, and 410c of absorbing stack 410, and the insulating layers 120 containing metal regions 122. Preferably, a handle 1410, for example, a semiconductor wafer, is then glued, on the front surface of insulating layers 120. All the elements from the rear surface of the substrate to a level defining the upper level of regions 110 are then removed, for example, by polishing.

Then, in a first step, filters 160BP are formed. For this purpose, for example, all the upper surfaces of regions 110 are covered with a first stack of alternated layers forming filter 160BP, after which the portions of the first stack of layers located at the locations of pixels 400R, 400G, and 400B are then removed, for example, by etching.

In a second step, filters 160BC are formed. To achieve this, for example, the structure obtained at the first step is covered with a second stack of layers corresponding to filters 160BC. The portions of the second stack located at the location of pixel 400Z are then removed, for example, by chemical mechanical polishing.

Filters 140R, 140G, and 140B, and optional filter 140Z, and then optional lenses 130, are then formed.

The parasitic radiations that the filter partially lets through are all the more numerous as the filter is thin. Due to the fact that absorbing stack 410 decreases the detection of these parasitic radiations, one may, for a given quantity of absorbed parasitic radiations, that is, for a given image quality, decrease the thickness of the filter with respect to a sensor comprising no layer 410A. Lenses 130 can then be brought closer to regions 110, which enables to increase the viewing angle of the sensor, and this, without altering the image quality. Further, a decrease in the width, or horizontal dimension, of a region 1420 where the second stack, which corresponds to filters 160BC, has its layers laterally stacked against the side of filter 160BP, corresponds to this thickness decrease. In region 1420, filter 160BC has degraded filtering properties. The fact of decreasing this region enables to decrease the size of the pixels without altering the image quality as compared with a sensor comprising no absorbing layer 410.

In the example of FIG. 10, absorbing stack 410 extends under pixels 400R, 400G, and 400B and under pixel 400Z. As a variant, stack 410 may extend under pixels 400R, 400G and 400B only and not extend under pixels 400Z. In this case, the manufacturing method is for example similar to what has just been described, with the difference that a step of local removal of absorbing stack 410 opposite pixels 400Z is provided before the step of deposition of insulating layers 120.

Figure 11:
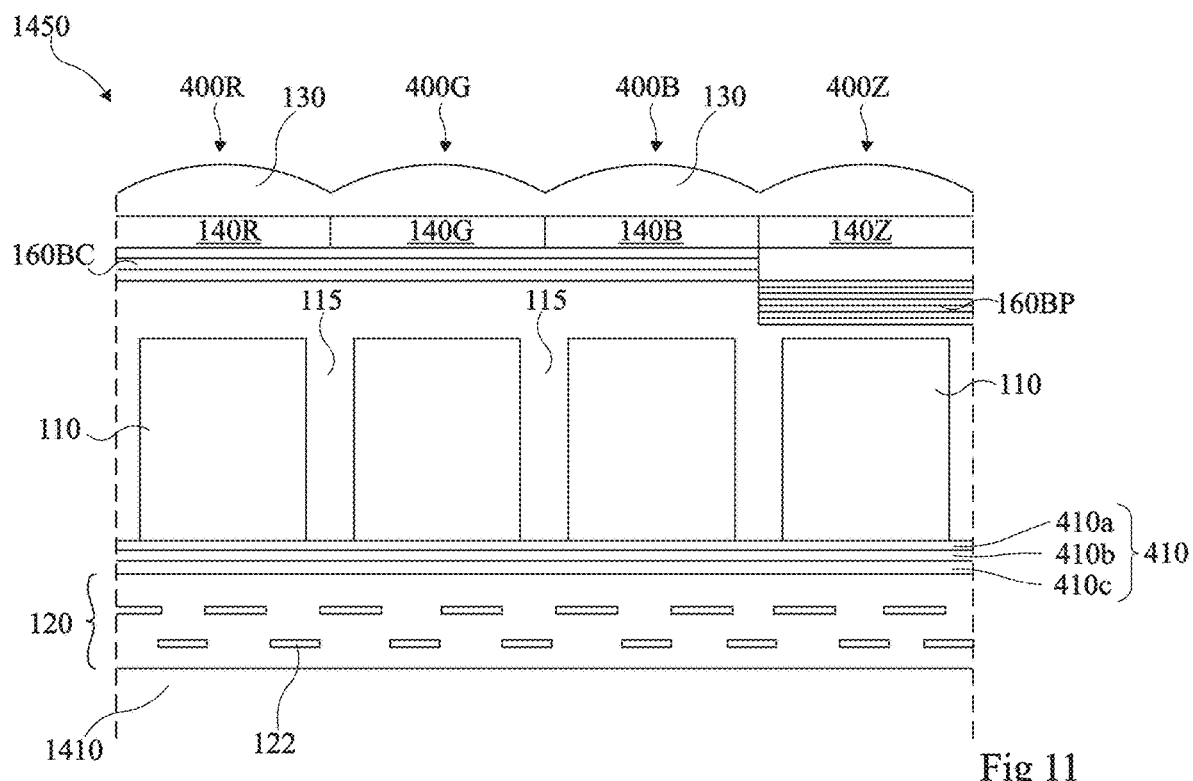
FIG. 11 is a cross-section view partially and schematically showing an example of an embodiment of an image sensor pixel.

FIG. 11 is a cross-section view partially and schematically showing an embodiment of an image sensor 1450 comprising pixels of the type of the pixel 400 of FIG. 4. Sensor 1450 shows the elements of sensor 1400 of FIG. 10, with the difference that the manufacturing of filters 160BC and 160BP comprises an additional step between the first and second steps.

At this additional step, a dielectric layer, for example, made of silicon oxide, is formed at the locations of pixels 400R, 400G, and 400B down to the upper level of filter 160BP formed at the first step. To achieve this, the structure obtained at the first step is covered with the oxide layer, after which all the elements located above the upper surface of filter 160BP are removed, for example, by chemical mechanical polishing.

Then, at the second step, the second stack, which corresponds to filter 160BC, is deposited over the planar surface left by the polishing, and the portions of the second stack are removed from the location of pixel 400Z by etching.

Advantageously, due to the fact that filters 160BC are formed on a planar surface and are delimited by etching, they form a stack of planar layers of constant thicknesses over the entire surface of the filter. The filtering quality is thus better than with a filter formed of layers which are non-planar and/or of non-constant thicknesses.

At a subsequent step, a dielectric layer portion, for example, made of silicon oxide, may be formed at the location of pixel 400Z, down to the upper level of filter 160BC. To achieve this, for example, the structure obtained at the second step is covered with a dielectric layer, for example, made of silicon oxide, after which all the elements located above the upper surface of filter 160BC are removed, for example, by chemical mechanical polishing.

Here again, although absorbing stack 410 has been shown as extending under pixels 400R, 400G, and 400B and under pixel 400Z, as a variant, stack 410 may extend under pixels 400R, 400G and 400B only and not extend under pixels 400Z.

Figure 12:
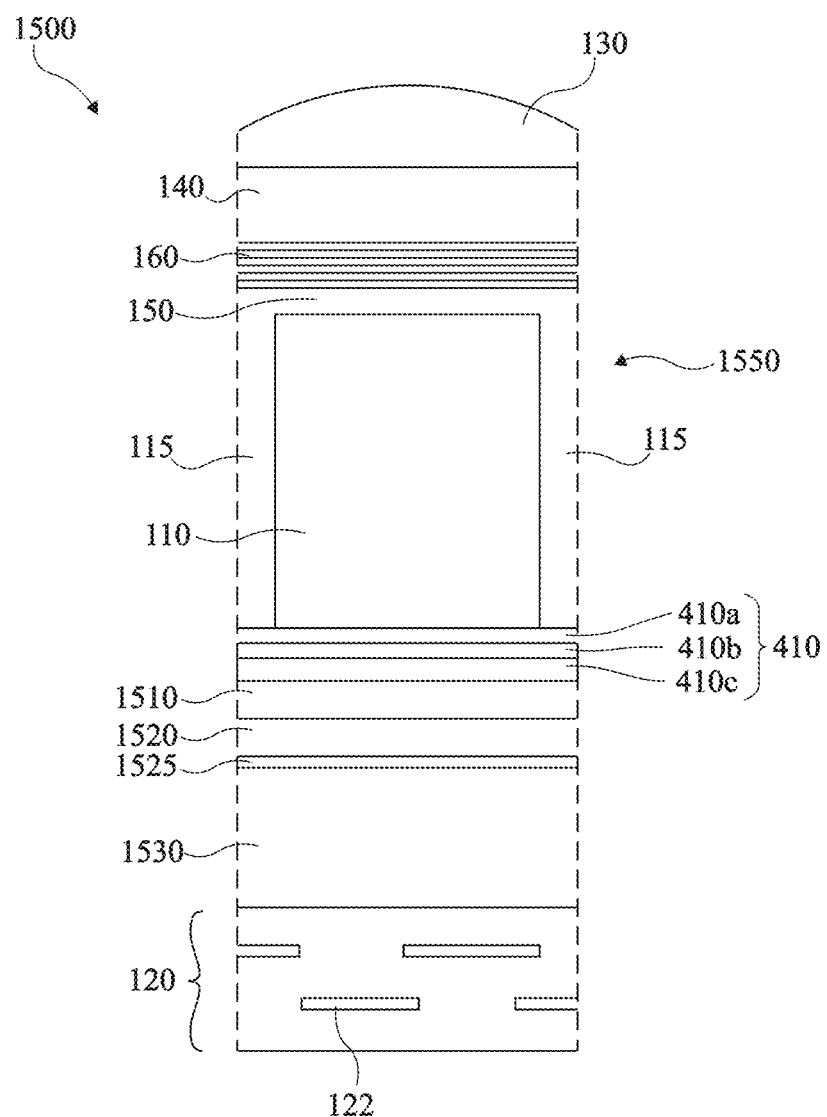
FIG. 12 is a cross-section view schematically showing an example of embodiment of an image sensor pixel.

FIG. 12 is a partial simplified cross-section view showing an example of an embodiment of an image sensor pixel 1500. Pixel 1500 comprises elements identical or similar to those of the pixel 400 of FIG. 4. Pixel 1500 differs from that of FIG. 4 in that it comprises, between absorbing stack 410 and insulating layer 120, successively from the lower surface of absorbing stack 410, a dielectric layer 1510, a conductive region 1520, an insulating layer 1525, and a semiconductor region 1530, for example, made of silicon. Conductive region 1520 and insulating layer 1525 may be omitted.

To form pixel 1500, region 110 and trenches 115 are formed in a semiconductor substrate. The front surface of the substrate (lower surface) is then covered with absorbing stack 410. The tungsten layer 410c of absorbing stack 410 is covered with dielectric layer 1510, for example, made of silicon oxide.

After dielectric layer 1510, conductive region 1520 is formed. For example, region 1520 defines a ground plane and covers the entire lower surface (or front side) of the semiconductor substrate. Insulating region 1525, for example, made of silicon oxide, is then formed. After this, semiconductor region 1530 is bonded to layer 1525 by molecular bonding. Components of electronic circuits of the image sensor are then formed, for example, transistors (not shown) inside and on top of semiconductor region 1530, on its lower surface side (front side). Then, insulating layers and metal regions 122 are formed. Regions 122 preferably correspond to interconnection tracks between components of the image sensor circuits.

Layer 150, interference filter 160, optional filter 140, and optional lens 130, are for example formed at a subsequent step of the pixel manufacturing.

An advantage of pixel 1500 is that part of the image sensor circuits are formed inside and on top of region 1530 independently from photodetector regions 110, which enables to decrease the pixel size or to integrate additional functions, as compared with an image sensor which does not comprise semiconductor region 1530. Further, the presence of region 1520 may enable to optimize the operation of the image sensor circuits.

The presence of layer 1510 and of region 1520 in pixel 1500 has the same effect on the reflection of light as layer 120 and regions 122 in the pixel 400 of FIG. 4. In pixel 1500, stack 410 limits the number of possible return travels of the radiations in cavity 110 after reflection, on region 1520 and on filter 160. An improved image quality is obtained, in a sensor comprising pixels of the type of pixel 1500, in the same way as in an image sensor comprising pixels of the type of the pixel 400 of FIG. 4.

Figure 13:
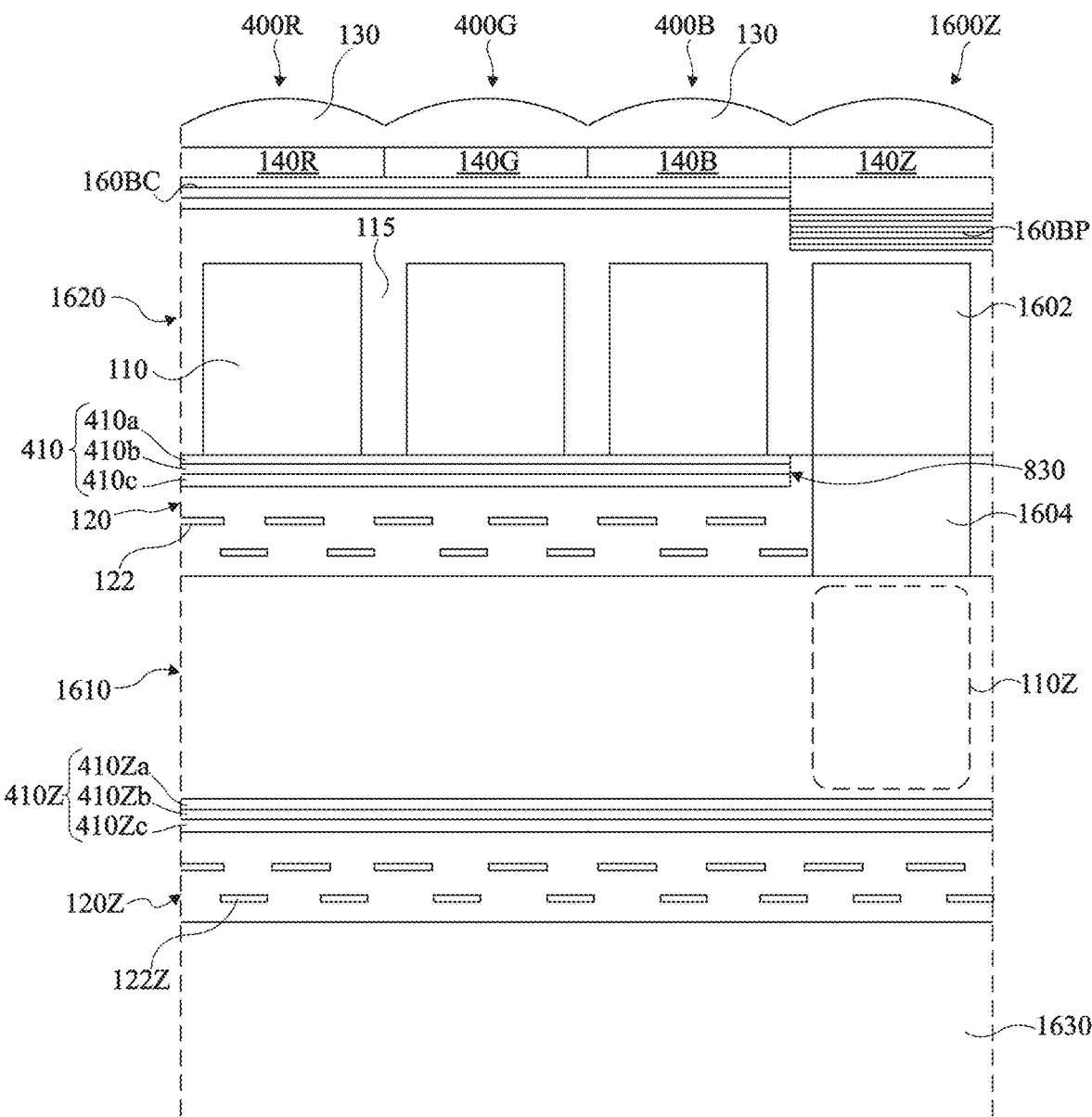
FIG. 13 is a cross-section view partially and schematically showing an example of another embodiment of an image sensor.

FIG. 13 is a cross-section view partially and schematically showing an embodiment of an image sensor 1600.

Image sensor 1600 comprises elements identical or similar to those of the sensor 1400 of FIG. 11, arranged identically or similarly, with the difference that pixel 400Z is replaced with a pixel 1600Z.

Pixel 1600Z comprises elements identical or similar to those of the pixel 400Z of FIG. 11, arranged identically or similarly, that is, a photodetector region 110Z, an absorbing stack layers 410Z comprising, in the order from the lower surface of photodetector region 110Z, a dielectric layer 410Za, a silicon layer 410Zb, and a tungsten layer 410Zc, and insulating layers 120Z. Photodetector region 110Z, stack 410Z, and insulating layers 120Z are identical or similar to respectively the photodetector region 110, the absorbing stack 410, and the insulating layers 120 of the pixel 400Z of FIG. 4. In pixel 1600Z, semiconductor photodetector region 110Z is located at a level lower than that of the photodetector regions 110 of pixels 400R, 400G, and 400B. Pixel 1600Z further comprises optical transmission regions 1602 and 1604 located between its photodetector region 110Z and its filter 160BP. It should be noted that in the shown example, in vertical projection, the contour of photodetector region 110Z substantially coincides with the contour of optical transmission regions 1602 and 1604. As a variant, photodetector region 110Z may extend, laterally, beyond optical transmission regions 1602 and 1604.

Region 1602 is located at the same level as the regions 110 of pixels 140R, 140G, and 140B, and region 1604 extends vertically between region 110Z and optical transmission region 1602. The region 110Z of pixel 1600Z is located in a substrate 1610 which extends horizontally under the layer 120 common to pixels 400R, 400G, and 400B. Absorbing stack 410Z and insulating layers 120Z are horizontally continued on the lower surface of substrate 1610.

Components such as transistors, not shown, are formed on the lower surface, or front surface, of substrate 1610. Such transistors are for example interconnected by tracks forming metal regions 122Z located in layer 120Z. Transmission region 1602 is preferably made of the same semiconductor as the regions 110 of pixels 400R, 400G, 400B. Region 1604 is preferably made of a dielectric, for example, of silicon nitride, or of amorphous silicon, and extends from the lower surface of region 1602 through absorbing stack 410 and insulating layers 120.

In operation, the optical radiations transmitted by filter 160BP are guided by optical regions 1602 and 1604 all the way to photodetector region 110Z.

The sensor may have densities of transistors and of metal interconnects formed by regions 122 and 122Z between the transistors which are greater than the densities of transistors and of interconnects in a sensor comprising no substrate 1610 extending under pixels 400R, 400G, and 400B. Sensor 1600 may be particularly compact.

To form sensor 1600, regions 110 and trenches 115 separating regions 110 are formed in a semiconductor substrate 1620, for example, made of silicon. One then forms, on the front surface of substrate 1620 (lower surface), optional components such as transistors, absorbing stack 410, insulating layers 120 containing metal regions 122, and region 1604.

One separately forms, on the front surface of substrate 1610 (lower surface) comprising regions 110Z, optional components such as transistors, absorbing stack 410Z, and the insulating layers 120Z containing metal regions 122Z.

A handle 1630, for example, a semiconductor substrate, is bonded to the front surface of insulating layer 120Z. The portions of substrate 1610 located on the rear surface side are then removed down to the upper level of regions 110Z, for example, by chemical mechanical polishing.

The rear surface of substrate 1610 is then bonded to the front surface of layer 120 and of region 1604.

All the elements are then removed from the rear surface of substrate 1620 down to a level defining the upper level of regions 110 of pixels 400R, 400B, and 400Z, for example, by polishing.

Filters 160BC, 160BP, 140R, 140G, 140B, optional filter 140Z and the possible lenses 130 are then formed, in the same way as that described in relation with FIG. 11 to form these elements.

As a variant, absorbing stack 410Z may be omitted in the structure of FIG. 13.

Various embodiments and variants have been described. Those skilled in the art will understand that certain features of these various embodiments and variants may be combined and other variants will occur to those skilled in the art. In particular, the variants and embodiments described in relation with FIGS. 8 and 9 are compatible with one another and may be applied, alone or in combination, to the embodiments of FIGS. 10 to 13.

In the above-described embodiments, the lower layer 410c of absorbing stack 410 preferably corresponds to a specific tungsten level, that is, only deposited for the forming of absorbing stack 410. However, as a variant, the lower layer 410c of absorbing stack 410 may correspond to a first metallization level of the sensor, where are also formed interconnection metallizations at the periphery of the pixels.

Finally, the practical implementation of the embodiments and variants described herein is within the capabilities of those skilled in the art based on the functional indications provided hereinabove.

The invention claimed is:

1. Image sensor comprising a plurality of pixels, each comprising:
    a semiconductor photodetector region;
    a metal region arranged on a first surface of the semiconductor region;
    a band-pass or band-stop interference filter arranged on a second surface of the semiconductor region opposite to the first surface; and
    between the semiconductor region and the metal region, an absorbing stack comprising, in the order from the semiconductor region, a dielectric layer, a silicon layer, and a tungsten layer;
    wherein the tungsten layer is in contact, at an upper surface, with a lower surface of the silicon layer.

2. Image sensor comprising a plurality of pixels, each comprising:
    a semiconductor photodetector region;
    a metal region arranged on a first surface of the semiconductor region;
    a band-pass or band-stop interference filter arranged on a second surface of the semiconductor region opposite to the first surface; and
    between the semiconductor region and the metal region, an absorbing stack comprising, in the order from the semiconductor region, a dielectric layer, a silicon layer, and a tungsten layer,
    wherein the tungsten layer is separated from a lower surface of the silicon layer only by a bonding layer having a thickness smaller than 10 nm.

3. Image sensor according to claim 1, wherein the absorbing stack is capable of absorbing, in a single passage, more than 50% of an incident radiation at the central wavelength of the passband or of the stop band of the interference filter.

4. Image sensor according to claim 1, wherein, in each pixel, the semiconductor region is made of silicon.

5. Image sensor according to claim 1, wherein the silicon layer has a thickness in the range from 20 to 100 nm.

6. Image sensor according to claim 1, wherein the tungsten layer has a thickness greater than or equal to 40 nm.

7. Image sensor according to claim 1, wherein the dielectric layer comprises one or a plurality of dielectric materials having refraction indexes smaller than that of silicon.

8. Image sensor according to claim 1, wherein, in each pixel, the tungsten layer is coupled to a node of application of a bias potential.

9. Image sensor according to claim 1, wherein, in each pixel, the interference filter comprises a repetition of alternated layers having different optical indexes.

10. Image sensor according to claim 1, wherein, in each pixel, a central wavelength of the band-pass or of the band-stop of the interference filter is in a wavelength range from 700 nm to 1,100 nm.

11. Image sensor according to claim 1, wherein each pixel comprises an additional colored or infrared filter covering the first surface of the semiconductor region.

12. Image sensor according to claim 2, wherein, in each pixel, the semiconductor region is made of silicon.

13. Image sensor according to claim 2, wherein the silicon layer has a thickness in the range from 20 to 100 nm.

14. Image sensor according to claim 2, wherein the tungsten layer has a thickness greater than or equal to 40 nm.

15. Image sensor according to claim 2, wherein, in each pixel, the interference filter comprises a repetition of alternated layers having different optical indexes.

16. Image sensor according to claim 2, wherein, in each pixel, the central wavelength of the passband or of the stop band of the interference filter is in a wavelength range from 700 nm to 1,100 nm.

17. Sensor according to claim 2, wherein said pixels are configured to detect visible light, the sensor further comprising at least one infrared pixel configured to detect infrared light.

18. Sensor according to claim 1, wherein said pixels are configured to detect visible light, the sensor further comprising at least one infrared pixel configured to detect infrared light.

19. Sensor according to claim 18, wherein the absorbing stack is present in the at least one infrared pixel.

20. Sensor according to claim 18, wherein the absorbing stack is not present in the at least one infrared pixel.

* * * * *